United States Patent [19]
Kaneko et al.

[11] Patent Number: 5,607,658
[45] Date of Patent: Mar. 4, 1997

[54] METHOD OF MANUFACTURING METALLIC OXIDE AND METALLIC OXIDE MANUFACTURED BY THE SAME

[75] Inventors: Norio Kaneko, Atsugi; Tamaki Kobayashi, Isehara, both of Japan

[73] Assignee: Canon Kabushiki Kaisha, Tokyo, Japan

[21] Appl. No.: 523,752

[22] Filed: Sep. 5, 1995

Related U.S. Application Data

[63] Continuation of Ser. No. 127,503, Sep. 28, 1993, abandoned.

[30] Foreign Application Priority Data

Sep. 29, 1992 [JP] Japan .................................. 4-282305

[51] Int. Cl.$^6$ ................................................. C04B 35/00
[52] U.S. Cl. ...................... 423/593; 501/1; 501/152; 501/123; 505/123; 505/461
[58] Field of Search .................................. 501/152, 123; 252/512; 423/593; 505/123, 461

[56] References Cited

U.S. PATENT DOCUMENTS

| | | | |
|---|---|---|---|
| 5,081,103 | 1/1992 | Gressler et al. | 505/780 |
| 5,102,860 | 4/1992 | Ovshinsky et al. | 505/780 |
| 5,252,545 | 10/1993 | Landingham | 505/238 |

FOREIGN PATENT DOCUMENTS

| | | |
|---|---|---|
| 0394015 | 4/1990 | European Pat. Off. . |
| 63-274657 | 11/1988 | Japan . |
| 01037464 | 2/1989 | Japan . |
| 64-100001 | 4/1989 | Japan . |
| 1-37464 | 5/1989 | Japan . |
| 4-124003 | 4/1992 | Japan . |

OTHER PUBLICATIONS

Abstract of Japanese Patent 01-037464, Feb. 8, 1989.

*Primary Examiner*—Melissa Bonner
*Attorney, Agent, or Firm*—Fitzpatrick, Cella, Harper & Scinto

[57] ABSTRACT

A metal oxide manufacturing method includes the steps of preparing the metal oxide expressed by a general formula of $A_xB_yC_zD_n$, (where A represents at least one element selected from a group consisting of a rare earth element, yttrium and an element obtained either by substituting part of rare earth elements with alkali metals or alkali earth metals or by substituting part of yttrium with alkali metals or alkali earth metals, B represents an alkali earth metal, C represents copper or an element obtained by substituting part of copper with transition metals, and D represents oxygen, and where when X=1, Y=2 to 4, Z=2.7 to 6 and n=6 to 13), reducing the metal oxide expressed by the general formula, and halogenating the reduced metal oxide. Part of oxygen (D) of the metal oxide expressed by the general formula is substituted with the halogen elements.

12 Claims, 3 Drawing Sheets

METHOD OF MANUFACTURING METALLIC OXIDE AND METALLIC OXIDE MANUFACTURED BY THE SAME

This application is a continuation of application Ser. No. 08/127,503 filed Sep. 28, 1993, now abandoned.

BACKGROUND OF THE INVENTION

1. Field of the Invention

The present invention relates to a method of manufacturing a metallic oxide, and more particularly, to a method of manufacturing a metallic oxide which can be utilized as a superconductive material exhibiting superconductivity at a specific temperature or below and applied to, for example, superconductive coils for power storage, magnetic shields, various electronic devices, such as Josephson devices, and superconductive magnets for use in medical apparatus and high-precision measuring apparatus, such as MRI and SQUID, as well as a metallic oxide manufactured by such a method.

2. Description of the Related Art

The superconductive materials which are currently available on the market or whose practical use has been examined are Nb, NbTi, Nb₃Sn and Nb₃Al. These conventional superconductive materials, however, have to be cooled to very low temperatures by liquid helium to make them superconductive. Further, these superconductive materials do not show superconductivity under a magnetic field of about 20 tesla or above. Such a characteristic is inherent in these materials, and thus a superconductive material having a higher critical temperature than the above-described conventional superconductive materials is required to allow a magnetic field of 20 tesla or above to be generated. However, the existence of such a material is not known in the art, and the use of a superconductive material under a magnetic field of 20 tesla or above has hence been basically impossible.

In recent years, various perovskite compounds containing Cu have been discovered. Among them are materials which exhibit superconductivity at a temperature higher than the boiling point of liquid nitrogen, such as Y—Ba—Cu—O (hereinafter referred to as a Y type), Bi—Sr—Ca—Cu—O (hereinafter referred to as a Bi type), or Tl—Sr—Ca—Cu—O (hereinafter referred to as a Tl type). These oxide superconductive materials have a higher critical temperature and a larger critical magnetic field than the conventional superconductive materials, and, due to their potential application in fields to which conventional superconductive materials cannot be applied, have been researched. However, Bi or Tl type superconductive materials are toxic, and hence cannot be used except under special conditions, from the viewpoint of safety. Furthermore, these superconductive materials are not chemically stable under conditions where water vapor and carbon dioxide co-exist. Also, they have a complicated crystal structure in which crystal phases having a plurality of different critical temperatures can co-exist, and provision of a Bi or Tl type superconductive material having a crystal structure of a single crystal phase is difficult. Further, Bi or Tl type superconductive materials have a very small lower critical magnetic field in which the superconductive material can be both superconducting and normally conducting. Y type superconductive materials are characterized in that the content of oxygen present near the surface of the material readily changes. Accordingly, when such Y type superconductive materials are employed as wire materials used for electronic devices or magnets, an interface between the superconductive material and a different type of material or an interface between the crystal grains of the superconductive material is not stable, making the characteristics of the product unstable. Therefore, despite the advantages of high reactivity with water contents and a larger lower critical magnetic field than Bi type materials, Y type superconductive materials cannot exhibit an excellent practical performance.

Among the superconductive materials containing halogen, for example, a Y type superconductive material with fluorine introduced therein is disclosed in Japanese Patent Laid-Open No. sho 63-274657. Japanese Patent Laid-Open No. hei 01-100001 discloses a ABCOD material (A represents an element forming IIA group of the periodic table, B represents an element forming IIIA group of the periodic table, C represents an element forming IB group of the periodic table, and D represents fluorine). Among the superconductive material manufacturing methods, a method of introducing fluorine by ion injection has been proposed in Japanese Patent Publication No. hei 04-40284, and a treating method by ClF₃ gas under a low pressure is disclosed in Japanese Patent Laid-Open No. hei 4-124003.

Although Y, Bi and Tl type superconductive materials having a critical temperature higher than the boiling point of liquid nitrogen are attractive materials, the practical use of such superconductive materials is limited due to safety problems and a deterioration in the reproducibility of the product characteristics caused by chemical instability. Japanese patent Laid-Open No. sho 63-274657 discloses a Y type superconductive mateirial into which fluorine is introduced at a concentration of 1/100 to 200% of the oxygen vacancy in the material. However, as the concentration of oxygen vacancy is unclear, the amount of fluorine in the superconductive material is unclear. Although the above-described prior art describes that $3 \times 10^{21}$ $cm^{-3}$ of fluorine are introduced into the Y type material by ion injection, it is inferred from this disclosure that the introduced fluorine is present in the material in the vicinity of the surface thereof. Also, a film of, for example, SiN is formed on the surface of that superconductive material. As a whole, the superconductive material disclosed in the above-described prior art is considered a material into which fluorine is introduced non-uniformly. Further, although the above-described prior art describes the instability of the portion which is 200 Å from the material surface, it does not describe the chemical stability of the material as a whole. The material disclosed in Japanese Patent Laid-Open No. hei 01-100001 has a composition of $Y_1Ba_2Cu_3F_{0.2}O_y$ and a critical temperature of 125 K. It is, however, difficult to manufacture, with good reproducibility, a Y type superconductive material having such a high critical temperature. The thus-manufactured Y type superconductive material has a problem involving reliability. In addition, there is no description in the above-described prior art about the chemical stability of the material.

Among the methods of manufacturing a superconductive material containing halogen, the halogenation method by ClF₃ gas disclosed in Japanese Patent Laid-Open No. hei 4-124003 requires not only a normally employed electric furnace but also special parts and special devices, such as a container made of Ni, an evaporating device, flow control of gas and treatment of exhaust gas, and hence cannot be readily applied to the manufacture of a large product. Further, this prior art teaches that even when the amount of oxygen in Y—Ba—Cu—O material is low, the on-set superconductive transition temperature can be improved. However, an increase in the weight per gram of the sample obtained in the above-described method by halogenation is from 0.01 to 0.05 grams. It is therefore inferred that chemical stability cannot be improved even through the critical temperature may be improved due to a high halogen substitution rate for oxygen. Japanese Patent Publication No. hei 04-40284 teaches the method of introducing fluorine by ion injection, and requires coating of SiN or AlN on the surface of the superconductive material. In this method, even if fluorine can be introduced into the vicinity of the material surface, it cannot be introduced uniformly over the entire material having a certain thickness. This method, which employs, as a material substance, a metal halide, is simple. However, it is difficult to accurately control reaction of the oxide with a halide in this method. Particularly, substitution of halide for special oxygen atoms can barely be controlled.

SUMMARY OF THE INVENTION

An object of the present invention is to provide a superconductive material which is safer than at least a Bi or Tl type superconductive material, and which has substantially equal superconductivity, such as a critical temperature, to that of a Y type superconductive material, and which is chemically stable. This object is achieved by substituting halogen atoms for part of the oxygen atoms contained in the material.

Specifically, the present invention provides a method of manufacturing a metal oxide, which comprises the steps of:

a) preparing the metal oxide expressed by a following general formula:

$$A_X B_Y C_Z D_n$$

where A represents at least one element selected from a group consisting of a rare earth element, yttrium and an element obtained either by substituting part of rare earth elements with alkali metals or alkaline earth metals or by substituting part of yttrium with alkali metals or alkaline earth metals, B represents an alkali earth metal, C represents copper or an element obtained by substituting part of copper with transition metals, and D represents oxygen, where X=1, Y=2 to 4, Z=2.7 to 6 and n=6 to 13;

b) reducing the metal oxide expressed by the general formula; and c) halogenating the reduced metal oxide. Part of oxygen (D) of the metal oxide expressed by the general formula is substituted with the halogen elements.

The present invention further provides a metal oxide manufactured by the above manufacturing method.

DETAILED DESCRIPTION OF THE PREFERRED EMBODIMENTS

Figure 1:
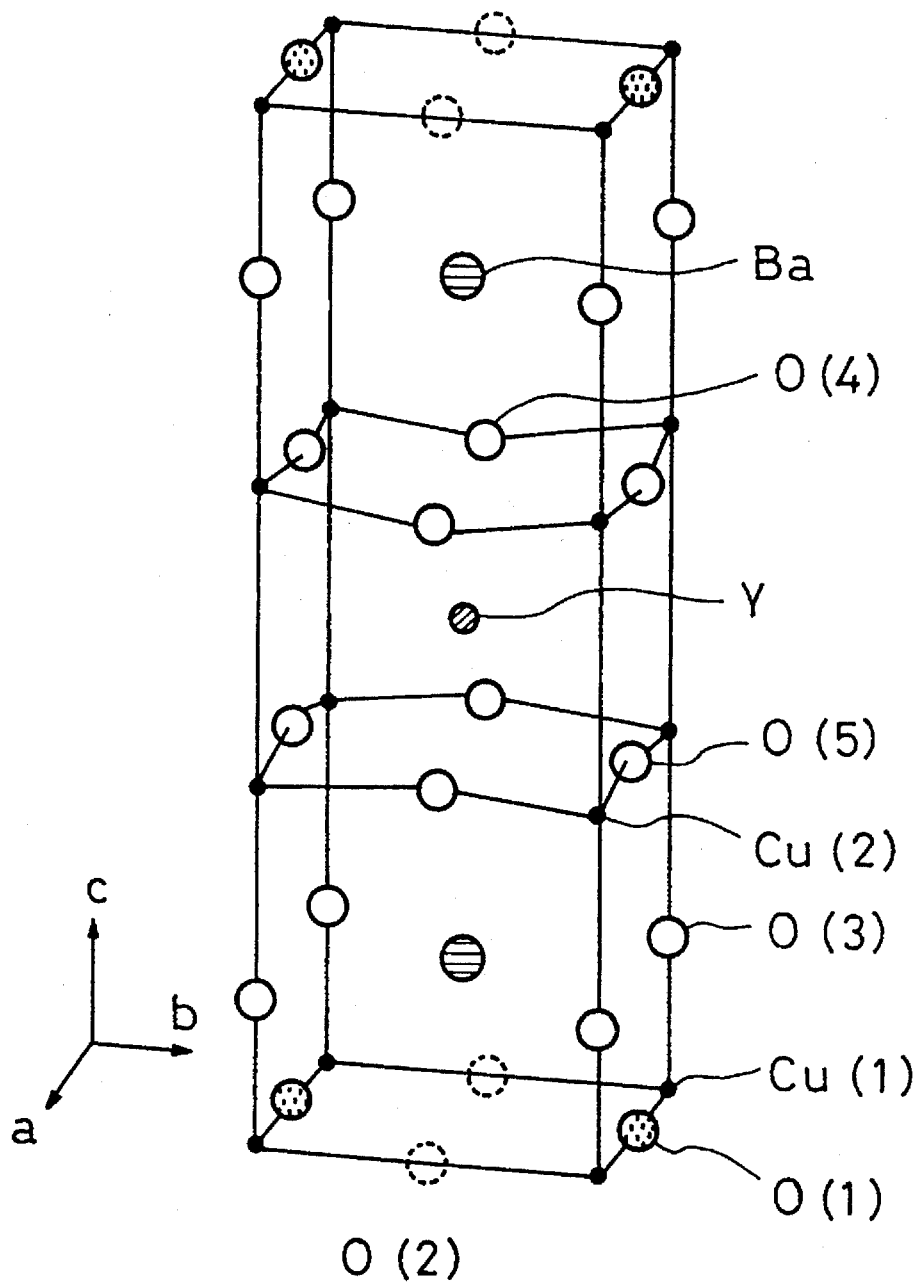
FIG. 1 illustrates the crystal structure of a typical oxide superconductive material.

FIG. 1 illustrates the crystal structure of Y—Ba—Cu—O, which is a typical superconductive material having a critical temperature higher than the boiling point of liquid crystal.

As can be seen from the figure, there are two types of sites for Cu in the crystal, i.e., there is a $CuO_2$ plane composed of Cu(2) and oxygen and a CuO chain composed of Cu(1) and oxygen. The CuO chain is substantially the same as the $CuO_2$ plane. However, it is called a chain for convenience because the oxygen which bonds with Cu(1) is readily removed and because the content of O(2) is small. The content of O(1) is smaller than that of, for example, O(3), because an oxygen atom moves from O(1) to O(2) in order to stabilize the plane made up of Cu (1), O(1) and O(2) or because an oxygen atom is removed to keep the electric charge of the entire material neutral. It is inferred that chemical instability of Y—Ba—Cu—O is correlated to such a structure of Cu and oxygen and that instability of the superconductive characteristics of a superconductive material is chiefly caused by changes in the amount of oxygen mainly located at sites whose rate of existence is low by an atmosphere. In order to improve chemical stability of the material, it is therefore necessary for atoms to be introduced into the sites whose rate of existence is low.

To synthesize an oxide in bulk, the heat treatment in an oxidized atmosphere containing oxygen by an electric furnace is generally employed. In that case, the amount of oxygen in the material is controlled by the temperature and time of the heat treatment and the oxygen concentration in the atmosphere. In the case of Y—Ba—Cu—O in which the oxygen sites whose rate of existence is basically low are present, however, no matter how the heat treatment conditions are changed, it is difficult to control the amount of oxygen to a specific value, because the atoms located at the sites whose rate of existence is low are basically unstable and this cannot be overcome by changing the manufacturing conditions. The present invention solves the instability of the superconductive material in the manner described below.

(Preferred Embodiments)

Here, $Y_1Ba_2Cu_3O_{7-x}$ is considered. In FIG. 1, since the occupation rate of O(2) site is low, the plane made up of Cu(1), O(1) and O(2) is locally in an instable condition due to the mutual movement of O(1) and O(2). However, since no oxygen can basically enter these sites, atoms other than oxygen atoms must be introduced into these sites to increase the rate of existence thereof and thereby improve stability. Also, to obtain excellent superconductivity, there must be a slight difference in the length between the a and b axes. Accordingly, halogen elements having the same valence sign as oxygen and which stably bond to both Cu and Ba are introduced in the present invention. In the crystal structure shown in FIG. 1, since the occupation rate of O(1) is higher than that of O(2), priority is given to O(2), and halogen enters O(2). At that time, halogen is introduced between the sites Cu(1) which adjoin in the direction of the b-axis. Consequently, the plane made up of Cu(1), O(1) and O(2) is stabilized, thus stabilizing the entire material. Halogen must be introduced in an amount which ensures that the length of the a-axis differs from the length of the b-axis and which ensures that no halide of Cu or Ba is produced. The amount of halogen which satisfies these conditions is $2\times10^{-3}$ to $1\times10^{-6}$ gram-equivalent per gram of metal oxide material in terms of oxygen. When halogen is introduced in an amount exceeding the above value, the difference in the length between the a and b axes is reduced, and the critical temperature decreases or the material does not show superconductivity. It is inferred that these occur because halogen is introduced to both O(1) and O(2). With a lesser amount of halogen, chemical stability cannot be improved.

Now, the method of manufacturing the above-described material will be described. $Y_2O_3$ powder, $BaCO_3$ powder and CuO powder are mixed with each other at a mixture ratio of Y:Ba:Cu=1:2:3. The powder mixture is heated in an oxygen atmosphere at a temperature ranging from 900° C. to 1000° C. to obtain a superconductive material having a critical temperature of about 90 K. Next, the obtained sample is reduced by heating it to about 400° C. in an nitrogen atmosphere. At that time, reduction should be performed such that only oxygen which has not been sufficiently stabilized by the heat treatment in the oxygen atmosphere and is hence in a relatively easily removed condition is reduced. Too much reduction reduces stable oxygen as well, which may in turn change the basic crystal structure. Although a preferable degree of reduction differs depending on the material, a preferable weight decrease caused by the oxygen removed by reduction is $1\times10^{-2}$ through $1\times10^{-6}$ grams per gram of the metal oxide which is not subjected to reduction, with more preferable weight decrease being $5\times10^{-3}$ through $1\times10^{-4}$ grams. The reduced sample is caused to react with a halogenating reagent by mixing the sample with a halogenating reagent which contains a halogen element but does not contain a metal element, such as ammonium chloride, ammonium bromide, polyvinyl chloride or Teflon resin, and then by heating the mixture in an oxygen atmosphere which contains 10% or more of oxygen. With an atmosphere which contains 10% or less of oxygen, the mixture is halogenated too much even when the reaction time is reduced. A desirable proportion of halogen elements relative to the reduced sample is within 200% of the removed oxygen or a weight increase of $10^{-2}$ grams or less per gram of the reduced sample. Thereafter, the halogenated sample is shaped into a desired form, and then heat treated again at a temperature ranging from 900° and 1000° C. to manufacture a superconductive material according to the present invention.

The present inventors consider that in the thus-obtained superconductive material, the unstable oxygen atoms have been removed by the reduction operation and halogen atoms have been introduced into those positions. Since bonding between Cu and halogen atoms is generally more stable than bonding between Cu and O, halogenation eliminates unstable elements from the material, making the material itself stable. However, when the amount of halogen is too high, the superconductive property is adversely affected or the composition of a superconductive material varies due to production of a halogenated substance of Ba, Cu or Y, thus deteriorating chemical stability of the material. Hence, the reaction time for halogenation is decreased when the reaction temperature is high, and is increased when the reaction temperature is low. The halogenation temperature is higher than the reduction temperature and is lower than the oxide synthesizing temperature, which is from 900° to 1000° C. because a too high halogenation temperature increases oxidation by the oxygen in the atmosphere. A gaseous halogenating reagent, such as $CF_4$ or $Cl_2$, may be employed. However, in that case, strict safety measures must be taken with the gas pipe. Also, contact of such a gas with the reduced sample during reaction may make reaction uniform but increases halogenation too much, making control of the amount of substituting halogen atoms difficult. Thus, it is preferred in the manufacturing method according to the present invention that a halogenating reagent, which is a solid at a room temperature be used. The thus-manufactured superconductive material has no unstable site in the crystal thereof, has an improved reactivity with water contents or carbon dioxide and is therefore safer than the conventional superconductive material to the environment.

(EXAMPLES)

Examples of the present invention and comparative examples will now be described with reference to Tables 1 through 3 and Tables 4 through 6, respectively.

(Example 1)

Figure 2:
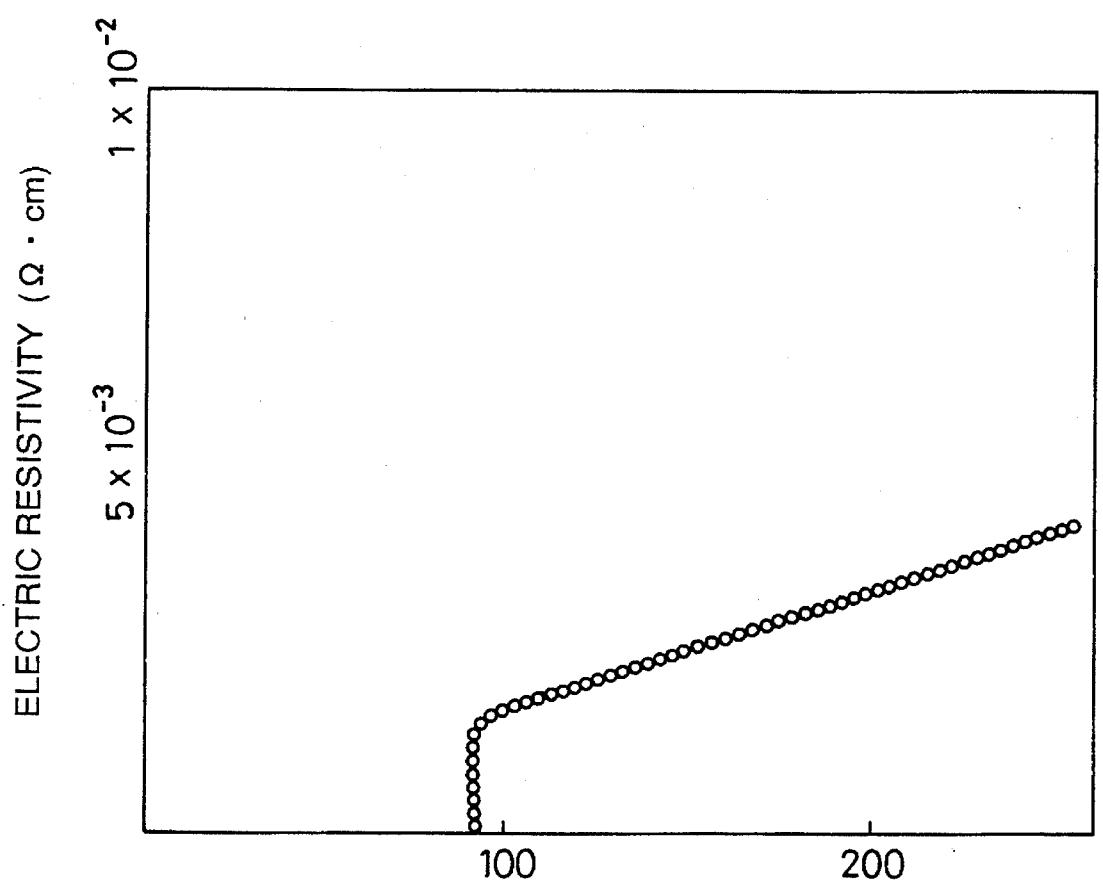
FIG. 2 is a graph showing the relation between the electric resistivity and the temperature.

$Y_2O_3$ powder, $BaCO_3$ powder and CuO powder were weighed such that a mixture ratio of Y:Ba:Cu=1:2:3 was assured and mixed with each other using an agate mortar. The mixture was heat treated at 950° C. for 10 hours in oxygen. The obtained sample was pulverized, and then heat treated at 950° C. for 10 hours. FIG. 2 is a graph showing the relation between the electric resistivity and the temperature of the obtained sample. This sample was a superconductive material having a critical temperature (Tc) of about 90 K. Next, the powder sample was reduced at 400° C. for 60 minutes under the condition that nitrogen was flowing at a rate of 100 ml/min. This heat treatment reduced the weight of the sample by $9.4\times10^{-4}$ grams per gram of the sample shown in FIG. 2. This decrease means that about $5.9\times10^{-5}$ gram-equivalent of oxygen atoms have been removed.

Ammonium fluoride was prepared in an amount which was twice that of the removed oxygen, and mixed with the reduced sample. The mixture was heat treated at 700° C. for an hour under the condition that a mixture gas of $N_2$: $O_2$=4:1 was flowing at a rate of 100 ml/min. Finally, this sample was shaped into pellets each having a diameter of 20 mmφ and a thickness of 2 mm. The pellets were heated at 950° C. for 10 hours in an oxygen atmosphere. The treatment with ammonium fluoride increased the weight of the sample by $1.9\times10^{-3}$ grams per gram of the reduced sample, because fluorine substituted for part of oxygen. The same effect can be obtained by heat treating the reduced sample with ammonium fluoride placed near the sample without mixing them.

Figure 3:
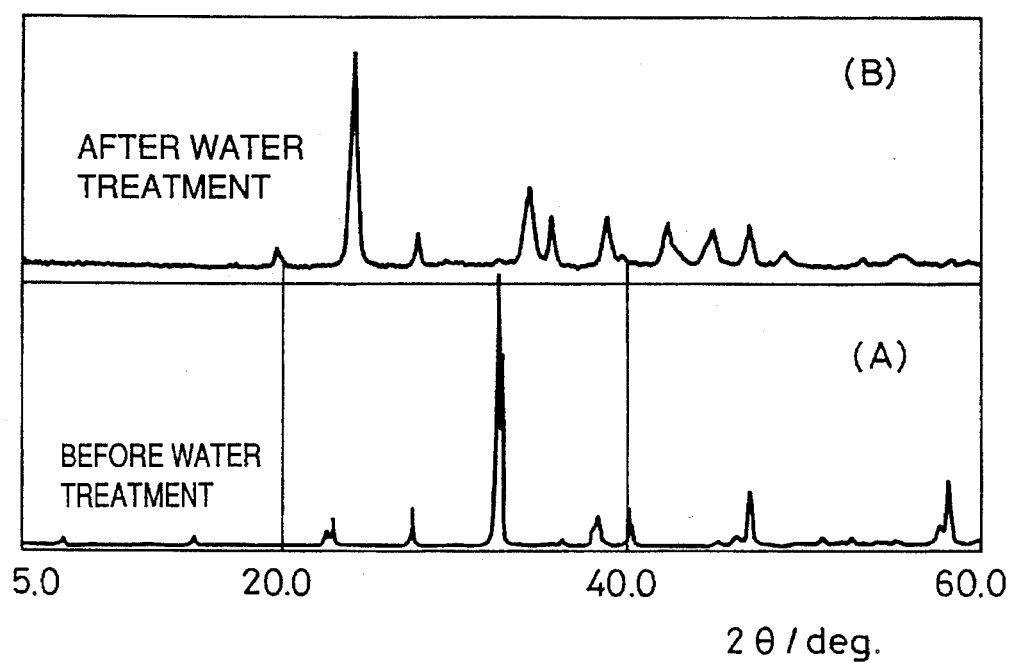
FIG. 3 shows an X-ray diffraction pattern of the results of a water-resistance test.

The temperature dependency of the electric resistivity of the thus-obtained sample was the same as that shown in FIG. 2. This indicates that superconductivity is not affected by fluorination. The reactivity of the fluorinated sample and the sample which was not subjected to fluorination with water was investigated at 40° C. and in the atmosphere saturated with vapor. The investigation yielded that the sample which was not subjected to fluorination completely decomposed in three days while the fluorinated sample remained substantially the same for a week. FIG. 3 is an X-ray diffraction pattern showing the vapor resistance of the material. Since the amount of substituting fluorine was less, the X-ray diffraction pattern of the manufactured material was barely affected by fluorination, as shown in FIG. 3(A). The lattice constants of the fluorinated sample, which were obtained by analyzing this X-ray diffraction pattern by Rietveld method, were A=3.8875 (Å), b=3.8261 (Å), and c=11.6822 (Å). Because the lattice constants of the non-fluorinated sample were a =3.8872 (Å), b=3.8233 (Å) and c=11.6823 (Å), the length of the b axis increased as compared with those of the a and c axes. This indicates that fluorine was introduced into O(2) sites. The non-fluorinated sample reacted with water and decomposed in the manner shown in FIG. 3(B). The sample according to the present invention reacted with water contents in the same manner as that shown in FIG. 3(A). This indicates that the chemical stability of the sample of the present invention was improved.

(Example 2)

A sample, prepared in the same manner as that of Example 1 except that $Er_2O_3$ was used in place of $Y_2O_3$, was chlorinated using ammonium chloride. Reduction of the sample decreased the weight of the sample by $6.8\times10^{-4}$ grams per gram of the sample (corresponding to $4.2\times10^{-5}$ gram-equivalent of oxygen atoms), and chlorination increased the weight of the sample by $3.9 \times 10^{-3}$ grams. It can be seen from this that oxygen was removed from the sample by reduction and that chloride was introduced into the sample by chlorination.

The critical temperature of the obtained sample was 93K, and was not affected by chlorination. However, chlorination improved the sample's reactivity with water vapor. That is, chlorination improved the stability of the sample which was placed in the atmosphere saturated with vapor at 40° C. and increased the time period during which the sample showed superconductivity by a factor of at least 3.

(Example 3)

$Er_2O_3$, $Ba(NO_3)_2$, CuO and $WO_3$ were mixed with each other at a ratio of Er:Ba: (Cu, W)=1:2:3 (Cu:W=2.8:0.2), and the mixture was heated at 900° C. in the atmosphere for 50 hours. The obtained sample was pulverized, and then heated again at 980° C. in an oxygen atmosphere for 20 hours. The heated sample was reduced at 300° C. in helium gas (200 ml/min) for 90 minutes. Thereafter, the reduced sample was mixed with ammonium chloride, and the mixture was heated at 500° C. for 60 minutes. The reactivity of the obtained sample with water contents was examined in the same manner as that of Examples 1 and 2. The examination yielded high stability and a high critical temperature of the sample. The reactivity of the sample remained substantially the same for one month. In the sample which was not subjected to chlorination, a white substance was precipitated on the surface thereof, and the sample was unstable as compared with the chlorinated sample.

(Comparative Example 1)

$Y_2O_3$ powder, $BaCO_3$ powder and CuO powder were weighed such that a mixture ratio of Y:Ba:Cu=1:2:3 was obtained and mixed with each other using an agate mortar. The mixture was heat treated at 950° C. for 10 hours in oxygen. The obtained sample was pulverized, and then heat treated at 950° C. for 10 hours. When the obtained sample was left in the atmosphere saturated with vapor at 40° C., the powder having a grain size of 100 μm completely decomposed and showed no superconductivity in 2 through 3 days, while pellets each having a diameter of 25 mm and a thickness of 2 mm completely decomposed and showed no superconductivity in 3 through 5 days.

(Comparative Example 2)

A sample was prepared in the same manner as that of Example 1 except that reduction temperature was changed from 400° C. to 700° C. Reduction decreased the weight of the sample by $1.7 \times 10^{-2}$ grams per gram of the sample (corresponding to $1.06 \times 10^{-3}$ gram-equivalent of oxygen atoms). In addition to halogenation by ammonium fluoride, halogenation was conducted on the sample using ammonium chloride, ammonium bromide and acid ammonium fluoride. However, the obtained samples were all insulators.

Other examples and comparative examples are listed in Tables 1 though 6.

Tables 1 and 4 show the composition of the metal oxide used as a material, the reduction temperature and the weight decrease caused by reduction (the number of grams). Table 2 and 5 show the halogenation conditions and the critical temperature of the obtained sample.

Tables 3 and 6 show the reactivity of the metal oxide material shaped in any of various forms with water vapor, i.e., the stability of the material.

TABLE 1

| Example | Composition of Metallic Oxide | Synthesizing Temperature (°C.) | Reduction Temperature (°C.) | Decrease of Weight (g)* | Value of Decreased Weight in Terms of Oxygen Atoms (gram equivalent) |
|---|---|---|---|---|---|
| 1 | Y:Ba:Cu = 1:2:3 | 950 | 400 (60 min) | $9.4 \times 10^{-4}$ | $5.9 \times 10^{-5}$ |
| 2 | Er:Ba:Cu = 1:2:3 | 930 | 400 (60 min) | $6.8 \times 10^{-4}$ | $4.3 \times 10^{-5}$ |
| 3 | Er:Ba:(Cu, W) = 1:2:3 Cu:W = 2.8:0.2 | 980 | 300 (90 min) | $5.6 \times 10^{-4}$ | $3.5 \times 10^{-5}$ |
| 4 | Y:Ba:Cu = 1:2.1:3.3 | 950 | 500 (60 min) | $2.1 \times 10^{-3}$ | $1.3 \times 10^{-4}$ |
| 5 | Er:Ba:(Cu, Mo) = 1:2:3.2 Cu:Mo = 2.9:0.1 | 1000 | 380 (90 min) | $2.6 \times 10^{-3}$ | $1.6 \times 10^{-4}$ |
| 6 | Ho:Ba:Cu = 1:2.2:3.5 | 940 | 400 (60 min) | $6.0 \times 10^{-4}$ | $3.8 \times 10^{-5}$ |
| 7 | Er:Ba:(Cu, W) = 1:2:3 Cu:W = 2.85:0.15 | 1000 | 350 (120 min) | $1.5 \times 10^{-3}$ | $8.1 \times 10^{-5}$ |
| 8 | Y:Ba:Cu = 1:3:6 | 900 | 300 (30 min) | $3.7 \times 10^{-4}$ | $2.3 \times 10^{-5}$ |
| 9 | Y:Ca:Ba:(Cu, W) = 0.95:0.05:2:3 Cu:W = 2.9:0.1 | 980 | 400 (90 min) | $3.3 \times 10^{-3}$ | $2.1 \times 10^{-4}$ |
| 10 | Er:Ba:Cu = 1:2:3 | 930 | 200 (90 min) | $1.7 \times 10^{-4}$ | $1.1 \times 10^{-5}$ |
| 11 | Gd:Ba:Cu = 1:2:3 | 950 | 400 (90 min) | $8.2 \times 10^{-4}$ | $5.1 \times 10^{-5}$ |
| 12 | Dy:Ba:Cu = 1:2:3 | 950 | 400 (90 min) | $7.8 \times 10^{-4}$ | $4.9 \times 10^{-5}$ |
| 13 | Er:(Ba, Sr):Cu = 1:2:3 Ba:Sr = 1.9:0.1 | 1000 | 300 (90 min) | $6.6 \times 10^{-4}$ | $4.1 \times 10^{-5}$ |
| 14 | Ho:Ba:Cu = 1:2.1:3.3 | 950 | 450 (90 min) | $1.1 \times 10^{-3}$ | $6.9 \times 10^{-5}$ |
| 15 | Er:Ba:(Cu, Re) = 1:2:3.2 Cu:Re = 2.9:0.1 | 1020 | 350 (120 min) | $1.2 \times 10^{-3}$ | $7.5 \times 10^{-5}$ |
| 16 | Ho:(Ba, Ca):Cu = 1:2.2:3.5 Ba:Ca = 2. 1:0.1 | 940 | 400 (60 min) | $6.1 \times 10^{-4}$ | $3.8 \times 10^{-5}$ |
| 17 | Er:(Bd, Sr):(Cu, W) = 1:2:3 Ba:Sr = 1.85:0.15, Cu:W = 2.85:0.15 | 1020 | 300 (60 min) | $4.5 \times 10^{-4}$ | $2.8 \times 10^{-5}$ |
| 18 | (Y, Ca):Ba:(Cu, W) = 1:3:6 | 1020 | 300 (60 min) | $5.4 \times 10^{-4}$ | $3.4 \times 10^{-5}$ |

TABLE 1-continued

| Example | Composition of Metallic Oxide | Synthesizing Temperature (°C.) | Reduction Temperature (°C.) | Decrease of Weight (g)* | Value of Decreased Weight in Terms of Oxygen Atoms (gram equivalent) |
|---|---|---|---|---|---|
| 19 | Y:Ca = 0.95:0.05, Cu:W = 5.5:0.5 (Y, Ca):(Ba, Sr):(Cu, W) = 1:2:3 Ba:Sr = 0.5:0.5, Cu:W = 2.9:0.1 | 1040 | 250 (60 min) | $1.8 \times 10^{-4}$ | $1.1 \times 10^{-5}$ |
| 20 | Dy:Ba:Cu = 1:2:3 | 950 | 200 (90 min) | $1.8 \times 10^{-4}$ | $1.1 \times 10^{-5}$ |
| 21 | Ho:Ba:Cu = 1:2.2:3.6 | 940 | 500 (90 min) | $1.0 \times 10^{-2}$ | $6.3 \times 10^{-4}$ |

*Decrease of weight per gram of the non-reduced sample, caused by reduction

TABLE 2

| Example | Critical Temperature K. | Halogenating Reagent | Halogenating Temperature | Halogenating Atomosphere |
|---|---|---|---|---|
| 1 | 92 | $NH_4F$ | 700 (60 min) | $N_2:O_2 = 4:1$ |
| 2 | 93 | $NH_4Cl$ | 700 (60 min) | $N_2:O_2 = 4:1$ |
| 3 | 92 | $NH_4Cl$ | 500 (60 min) | $He:O_2 = 1:1$ |
| 4 | 89 | $NH_4Cl$ | 600 (90 min) | $He:O_2 = 1:1$ |
| 5 | 92 | $NH_4F$ | 700 (30 min) | $N_2:O_2 = 4:1$ |
| 6 | 94 | $NH_4F$ | 650 (60 min) | $He:O_2 = 4:1$ |
| 7 | 91 | $NH_4Cl$ | 700 (30 min) | $N_2:O_2 = 4:1$ |
| 8 | 92 | $NH_4F$ | 700 (60 min) | $N_2:O_2 = 4:1$ |
| 9 | 88 | $NH_4Cl$ | 600 (60 min) | $N_2:O_2 = 2:1$ |
| 10 | 92 | $NH_4Br$ | 400 (60 min) | $Ar:O_2 = 4:1$ |
| 11 | 91 | $NH_4F$ | 650 (60 min) | $N_2:O_2 = 5:1$ |
| 12 | 92 | $NH_4F \cdot HF$ | 680 (60 min) | $N_2:O_2 = 4:1$ |
| 13 | 90 | $NH_4Cl$ | 450 (80 min) | $He:O_2 = 2:1$ |
| 14 | 92 | $NH_4F \cdot HF$ | 600 (90 min) | $He:O_2 = 2:1$ |
| 15 | 90 | $NH_4Cl$ | 620 (60 min) | $N_2:O_2 = 5:1$ |
| 16 | 89 | $NH_4F$ | 700 (60 min) | $He:O_2 = 9:1$ |
| 17 | 87 | Polyvinyl chloride | 700 (60 min) | $N_2:O_2 = 9:1$ |
| 18 | 89 | $NH_4Br$ | 650 (60 min) | $He:O_2 = 4:1$ |
| 19 | 88 | $NH_4Cl$ | 550 (60 min) | $Ar:O_2 = 4:1$ |
| 20 | 92 | $NH_4F \cdot HF$ | 400 (90 min) | $N_2:O_2 = 4:1$ |
| 21 | 89 | $NH_4F \cdot HF$ | 600 (90 min) | $N_2:O_2 = 2:1$ |

TABLE 3

| Example | Shape | Temperature K. after a Week (Temperature Reduction) |
|---|---|---|
| 1 | Powder (~100 μmφ) | 91(−1) |
| 2 | Pellet (25 mmφ × 2 mm) | 92(−1) |
| 3 | Pellet (25 mmφ × 2 mm) | 92(0) |
| 4 | Pellet (25 mmφ × 2 mm) | 85(−4) |
| 5 | Powder (~100 μmφ) | 92(0) |
| 6 | Pellet (25 mmφ × 2 mm) | 90(−4) |
| 7 | Pellet (25 mmφ × 2 mm) | 89(−2) |
| 8 | Pellet (25 mmφ × 2 mm) | 84(−8) |
| 9 | Pellet (25 mmφ × 2 mm) | 86(−2) |
| 10 | Pellet (25 mmφ × 2 mm) | 87(−5) |
| 11 | Powder (~100 μmφ) | 90(−1) |
| 12 | Pellet (25 mmφ × 2 mm) | 91(−1) |
| 13 | Pellet (25 mmφ × 2 mm) | 88(−2) |
| 14 | Pellet (25 mmφ × 2 mm) | 91(−1) |
| 15 | Powder (~100 μmφ) | 87(−3) |
| 16 | Pellet (25 mmφ × 2 mm) | 86(−3) |
| 17 | Pellet (25 mmφ × 2 mm) | 86(−1) |
| 18 | Pellet (25 mmφ × 2 mm) | 84(−5) |
| 19 | Pellet (25 mmφ × 2 mm) | 81(−7) |
| 20 | Pellet (25 mmφ × 2 mm) | 88(−4) |
| 21 | Pellet (25 mmφ × 2 mm) | 80(−9) |

TABLE 4

| Comperative Example | Composition of Metallic Oxide | Synthesizing Temperature | Reduction Temperature | Decrease of Weight (g)* |
|---|---|---|---|---|
| 1 | Y:Ba:Cu = 1:2:3 | 950 | — | — |
| 2 | Y:Ba:Cu = 1:2:3 | 920 | 700 (60 min) | $1.7 \times 10^{-2}$ |
| 3 | Ho:Ba:Cu = 1:2.2:3.5 | 940 | 800 (60 min) | $1.2 \times 10^{-2}$ |
| 4 | Er:Ba:(Cu, W) = 1:2:3 Cu:W = 2.8:0.2 | 950 | 750 (60 min) | $1.4 \times 10^{-2}$ |
| 5 | Gd:Ba:Cu = 1:2:3 | 950 | 900 (30 min) | $6.9 \times 10^{-2}$ |
| 6 | Er:(Ba, Sr):Cu = 1:2:3 Ba:Sr = 1.9:0.1 | 1000 | 650 (120 min) | $3.8 \times 10^{-2}$ |

TABLE 5

| Comperative Example | Critical Temperature K. | Halogenating Reagent | Halogenating Temperature | Halogenating Atmosphere |
|---|---|---|---|---|
| 1 | 92 | — | — | — |
| 2 | Insulator | $NH_4F$ | 700 (60 min) | $N_2:O_2 = 4:1$ |
| 3 | 68 | $NH_4F$ | 650 (60 min) | $He:O_2 = 4:1$ |
| 4 | Insulator | $NH_4Cl$ | 700 (60 min) | $He:O_2 = 1:1$ |
| 5 | 37 | $NH_4F$ | 600 (90 min) | $N_2:O_2 = 2:1$ |

TABLE 5-continued

| Comperative Example | Critical Temperature K. | Halogenating Reagent | Halogenating Temperature | Halogenating Atmosphere |
|---|---|---|---|---|
| 6 | 71 | NH₄Br | 550 (90 min) | He:O₂:1:1 |

TABLE 6

| Comperative Example | Shape | Condition after a week |
|---|---|---|
| 1 | Pellet (25 mmφ × 2 mm) | Decomposed and showed no superconductivity |
| 2 | Powder (~100 μmφ) | — |
| 3 | Pellet (25 mmφ × 2 mm) | Decomposed and showed no superconductivity |
| 4 | Pellet (25 mmφ × 2 mm) | — |
| 5 | Pellet (25 mmφ × 2 mm) | Decomposed and showed no superconductivity |
| 6 | Pellet (25 mmφ ×2 mm) | Decomposed and showed no superconductivity |

*Because of insulator, no water resistance test was conducted

As will be understood from the foregoing description, it is possible according to the manufacturing method of the present invention to manufacture a chemically stable superconductive material having a high critical temperature. Further, an inexpensive halogenating reagent which is neither special nor toxic can be employed, and all the operations can be performed under atmospheric pressure. The halogenated reagent used in the present invention, which is solid at room temperature, is sublimated and decomposes when the temperature increases. Thus, the halogenating reaction is substantially regarded as a solid-gas reaction, and the reacting condition thereof does not change as the degree of mixture changes, as in the case of a solid-solid reaction. Further, the superconductive material according to the present invention can solve the problems with changes in the properties of the manufactured thin film or precipitation of impurities on the crystal interface of a wire material, which are caused by the instability of the surface of a superconductive material, e.g., Y₁Ba₂Cu₃O₇-x.

What is claimed is:

1. A method of manufacturing a metal oxide, said method comprising the steps of:

a) preparing the metal oxide expressed by a following general formula:

$A_x B_y C_z D_n$ where A represents at least one element selected from a group consisting of a rare earth element, yttrium and an element obtained either by substituting part of rare earth elements with alkali metals or alkaline earth metals, or by substituting part yttrium with alkali metals or alkaline earth metals, B represents an alkaline earth metal, C represents copper or an element obtained by substituting part of copper with transition metals, and D represents oxygen, where X=1, Y=2 to 4, Z=2.7 to 6 and n=6 to 13;

b) reducing the metal oxide expressed by said general formula wherein said reducing is sufficiently controlled to maintain a basic crystalline structure; and said reducing process is performed under normal atmospheric pressure and in an inactive atmosphere;

c) halogenating the reduced metal oxide, wherein part of oxygen (D) of the metal oxide expressed by said general formula is substituted with the halogen elements using a halogenating reagent which is solid at room temperature; and d) wherein said halogenation step is performed in an oxidizing atmosphere which contains not less than 10% of oxygen.

2. A method of manufacturing a metal oxide according to claim 1, wherein said halogenation step comprises a step in which the halogen elements are introduced into part of sites of oxygen (D) of the metal oxide expressed by said general formula using a halogenating reagent which contains halogen and no metal element and is solid at room temperature.

3. A method of manufacturing a metal oxide said method comprising the steps of:

a) preparing the metal oxide expressed by a following general formula:

$A_z B_y C_z D_n$ where A represents at least one element selected from a group consisting of a rare earth element, yttrium and an element obtained either by substituting part of rare earth elements with alkali metals or alkaline earth metals or by substituting part of yttrium with alkali metals or alkaline earth metals, B represents an alkaline earth metal, C represents copper or an element obtained by substituting part of copper with transition metals, and D represents oxygen, and where when X=1, Y=2 to 4, Z=2.7 to 6 and n=6 to 13;

b) reducing the metal oxide expressed by said general formula wherein said reducing step is sufficiently controlled to maintain a basic crystalline structure, and said reducing process is performed under non-reduced atmosphere pressure, and, wherein said reduction step comprises a step in which a weight of the metal oxide decreases by $1 \times 10^{-2}$ through $1 \times 10^{-6}$ grams per gram of the metal oxide expressed by said general formula;

c) halogenating the reduced metal oxide, wherein part of oxygen (D) of the metal oxide expressed by said general formula is substituted with the halogen elements using a halogenating reagent which is solid at room temperature.

4. A method of manufacturing a metal oxide according to claim 1, wherein said reduction step is performed in an inactive atmosphere which contains no more than 5% of oxygen.

5. A method of manufacturing a metal oxide said method comprising the steps of:

a) preparing the metal oxide expressed by a following general formula:

$A_z B_y C_z D_n$ where A represents at least one element selected from a group consisting of a rare earth element, yttrium and an element obtained either by substituting part of rare earth elements with alkali metals or alkaline earth metals or by substituting part of yttrium with alkali metals or alkaline earth metals, B represents an alkaline earth metal, C represents copper or an element obtained by substituting part of copper with transition metals, and D represents oxygen, and where when X=1, Y=2 to 4, Z=2.7 to 6 and n=6 to 13;

b) reducing the metal oxide expressed by said general formula wherein said reducing step is sufficiently controlled to maintain a basic crystalline structure, and said reducing process is performed under non-reduced atmosphere pressure, and, wherein said reduction step is performed at a temperature lower than that at which the metal oxide expressed by said general formula is prepared;

c) halogenating the reduced metal oxide, wherein part of oxygen (D) of the metal oxide expressed by said general formula is substituted with the halogen elements using a halogenating reagent which is solid at room temperature.

6. A method of manufacturing a metal oxide, said method comprising the steps of:

a) preparing the metal oxide expressed by a following general formula:

$$A_x B_y C_z D_n$$

where A represents at least one element selected from a group consisting of a rare earth element, yttrium and an element obtained either by substituting part of rare earth elements with alkali metals or alkaline earth metals, B represents an alkaline earth metal, C represents copper or an element obtained by substituting part of copper with transition metals, and D represents oxygen, where X=1, Y=2 to 4, Z=2.7 to 6 and n=6 to 13;

b) reducing the metal oxide expressed by said general formula wherein said reducing is sufficiently controlled to maintain a basic crystalline structure; and said reducing process is performed under normal atmospheric pressure and in an inactive atmosphere;

c) halogenating the reduced metal oxide, wherein said halogenation step comprises a step in which the halogen elements are introduced into part of sites of oxygen (D) of the metal oxide expressed by said general formula using a halogenating reagent which contains halogen and no metal element and is solid at room temperature; and said halogenation step is performed in an oxidizing atmosphere which contains no less than 10% of oxygen.

7. A method of manufacturing a metal oxide according to claim 3, wherein said reduction steps performed in an inactive atmosphere that contains no more than 5% of oxygen.

8. A method of manufacturing according to claim 3, wherein said halogenation step is performed in an oxidizing atmosphere which contains no less than 10% of oxygen.

9. A method of manufacturing a metal oxide according to claim 5, wherein said reduction step is performed in an inactive atmosphere which contains less than 5% of oxygen.

10. A method of manufacturing a metal oxide according to claim 5, wherein said halogenation step is performed in an oxidizing atmosphere which contains no less than 10% of oxygen.

11. A method of manufacturing a metal oxide according to claim 3, wherein said halogenating reagent does not include a metal element.

12. A method of manufacturing a metal oxide according to claim 5, wherein said halogenating reagent does not include a metal element.

\* \* \* \* \*

UNITED STATES PATENT AND TRADEMARK OFFICE
CERTIFICATE OF CORRECTION

PATENT NO. : 5,607,658

DATED : March 4, 1997

INVENTOR(S) : NORIO KANEKO, ET AL.          Page 1 of 2

It is certified that error appears in the above-identified patent and that said Letters Patent is hereby corrected as shown below:

COLUMN 2

Line 29, "patent" should read --Patent--; and
Line 30, "mateirial" should read --material--.

COLUMN 5

Line 5, "an" should read --a--.

COLUMN 6

Line 25, "mm$\phi$and" should read --mm$\phi$ and--.

COLUMN 7

Line 15, "Er2O3, Ba(NO3)2," should read
--$Er_2O_3$, $Ba(NO_3)_2$,-- and
"WO3" should read --$WO_3$--.

COLUMN 8

Line 31, "Table" should read --Tables--; and
Table 1, "2. 1:0.1" should read --2.1:0.1-- and
"Er:(Bd, Sr):(Cu, W)" should read
--Er:(Ba, Sr):(Cu, W)--.

COLUMN 10

Table 3, "Temperature K." should read,
--Critical Temperature K.--;
Table 4, "Comperative" should read --Comparative--; and
Table 5, "Comperative" should read --Comparative--.

UNITED STATES PATENT AND TRADEMARK OFFICE
CERTIFICATE OF CORRECTION

PATENT NO. : 5,607,658

DATED : March 4, 1997

INVENTOR(S) : NORIO KANEKO, ET AL.

It is certified that error appears in the above-identified patent and that said Letters Patent is hereby corrected as shown below:

COLUMN 11

```
    Table 5-continued, "Comperative" should read
            --Comparative--; and
    Table 6, "perative" should read --parative--.
```

COLUMN 12

```
    Line 21, "oxide" should read --oxide,--; and
    Line 54, "oxide" should read --oxide,--.
```

Signed and Sealed this

Nineteenth Day of August, 1997

Attest:

BRUCE LEHMAN

*Attesting Officer*     *Commissioner of Patents and Trademarks*